(12) United States Patent
Borenstein et al.

(10) Patent No.: US 10,354,962 B2
(45) Date of Patent: Jul. 16, 2019

(54) METHOD AND APPARATUS FOR A DESTROY ON-DEMAND ELECTRICAL DEVICE

(71) Applicant: The Charles Stark Draper Laboratory Inc., Cambridge, MA (US)

(72) Inventors: Jeffrey T. Borenstein, Newton, MA (US); Gregory M. Fritz, Wakefield, MA (US); Jonathan R. Coppeta, Windham, NH (US); Brett C. Isenberg, Newton, MA (US)

(73) Assignee: The Charles Stark Draper Laboratory Inc., Cambridge, MA (US)

( * ) Notice: Subject to any disclaimer, the term of this patent is extended or adjusted under 35 U.S.C. 154(b) by 0 days.

(21) Appl. No.: 15/331,501

(22) Filed: Oct. 21, 2016

(65) Prior Publication Data
US 2017/0117235 A1 Apr. 27, 2017

Related U.S. Application Data

(60) Provisional application No. 62/244,221, filed on Oct. 21, 2015, provisional application No. 62/244,223, filed on Oct. 21, 2015.

(51) Int. Cl.
*H01L 29/84* (2006.01)
*H01L 23/00* (2006.01)

(52) U.S. Cl.
CPC .................. *H01L 23/573* (2013.01)

(58) Field of Classification Search
CPC ....................................... H01L 23/573
USPC .......................................... 257/415
See application file for complete search history.

(56) References Cited

U.S. PATENT DOCUMENTS

| 7,531,431 B2* | 5/2009 | Rayfield | B28D 5/0076 |
| | | | 257/E21.599 |
| 2011/0311611 A1* | 12/2011 | Ng | A61L 15/425 |
| | | | 424/448 |

OTHER PUBLICATIONS

Cerniglia, N., et al., Dissolution of germanium in aqueous hydrogen peroxide solution. J. Electrochem. Soc., 1962, vol. 109, issue 6, pp. 508-512.

(Continued)

*Primary Examiner* — Tan N Tran
(74) *Attorney, Agent, or Firm* — Womble Bond Dickinson (US) LLP; John J. Penny, Jr.

(57) ABSTRACT

A destroy on-demand electrical device includes a substrate layer formed using a soluble material (e.g., a Germanium oxide), a semi-conductor layer formed from a material that can become soluble upon further processing (e.g., Germanium) and conductive elements, formed from a metallic material such as Copper. The device is coupled with one or more disintegration sources that contain disintegration agents (e.g., Hydrogen Peroxide) that can promote disintegration of the device. The device can be destroyed in response to actuation of the disintegration sources, for example by actuation of a source that produces Hydrogen Peroxide for use in oxidizing the semi-conductor layer. Water can be used to dissolve dissolvable substrate layers. The semi-conductor layer can be destroyed by first processing this layer to form a dissolvable material and dissolving the processed layer with water. The remaining Copper components disintegrate once their underlying layer have been dissolved and/or by use of a salt.

23 Claims, 8 Drawing Sheets

(56) References Cited

OTHER PUBLICATIONS

Levine, A.G., John Bardeen, William Shockley, Walter Brattain: Invention of the transistor—Bell Laboratories. American Physical Society Sites, 2008, 3 pages.

Murthy, M.K., et al., Studies in germanium oxide systems: III, solubility of germania in water. Journal of the American Ceramic Society, Feb. 1965, vol. 48, issue 2, pp. 109-110.

Onsia, B., et al., On the application of a thing ozone based wet chemical oxide as an interface for ALD high-k deposition. Solid State Phenomena, 2005, vol. 103-4. pp. 19-22.

Tao, S.H., et al., Hazard assessment of germanium supplements. Regulatory Toxicology and Pharamcology, Jun. 1997, vol. 25, issue 3, pp. 211-219.

\* cited by examiner

METHOD AND APPARATUS FOR A DESTROY ON-DEMAND ELECTRICAL DEVICE

RELATED APPLICATIONS

This application claims the benefit of and priority to U.S. Provisional Patent Application No. 62/244,221, filed Oct. 21, 2015 and U.S. Provisional Patent Application No. 62/244,223, filed Oct. 21, 2015, the contents of which are hereby incorporated herein by reference in their entirety.

FIELD OF INVENTION

The present disclosure generally relates to a destroy on-demand apparatus and methods and materials for manufacturing and destroying the destroy-on-demand apparatus.

BACKGROUND

Electronic chips and devices have numerous applications. For example, sophisticated electronic chips and devices can be manufactured at relatively low cost and used in a wide range of remote sensing and communications applications. Such electrical devices can be placed in remote and distributed locations for clandestine use in various technologies, such as defense (e.g., in a battlefield), security, or clinical applications (e.g., for diagnostics, monitoring, therapeutic applications, and drug delivery). However, once disposed in remote and/or distributed locations, these electrical devices may not be easily recoverable. For example, it may not be practical to track and recover every electronic chip or device placed within a battlefield. Similarly, in clinical applications, it may not be practical to remove an electronic that may be positioned in a remote location, for example at a location within a human body. Although various techniques for generation of self-vanishing or self-destroying electronic have been proposed, such approaches generally either use electronics that result in diminished performance (e.g., nano-crystalline silicon, organic electronics) or require destroying the electrical device using elements that may not be feasible for use in all applications (e.g., force, heat, electrical discharge, etc. that are not feasible for all applications, for example clinical applications).

SUMMARY

In one aspect of at least one embodiment of the invention relates to a destroy-on-demand electrical device and its corresponding methods and materials. The destroy-on-contact electronic device comprises a substrate formed from a dissolvable material, an electrical circuit on the substrate, and a disintegration agent source. The disintegration source contains one or more disintegration agents that cause destruction of the electrical device upon coming in contact with the substrate.

In another aspect of at least one embodiment of the invention, a destroy-on-demand electrical device is featured. The destroy-on-contact electronic device comprises a substrate formed from a dissolvable material, an electrical circuit on the substrate, a disintegration agent source, and an actuator. The disintegration agent source contains one or more components that promote disintegration of the substrate. The disintegration agent source is positioned proximate to the substrate. The actuator is connected to the disintegration agent source and configured to trigger, upon actuation, release of a disintegration agent, formed using the one or more components in the disintegration agent source, onto the substrate. The disintegration agent is configured to disintegrate the substrate, thereby causing destruction of the electrical device.

In yet another aspect of at least one embodiment of the invention, a destroy-on-demand electrical device including a Germanium-based substrate is featured. The electrical device includes an electrical circuit on the Germanium-based substrate and an oxidizing agent source. The oxidizing agent source contains one or more oxidization agents that oxidize the Germanium-based substrate upon coming in contact with the substrate, thereby destroying the electrical device.

In another aspect of at least one embodiment of the invention, a destroy-on-demand electrical device including a Germanium-based substrate is featured. The electrical device includes an electrical circuit on the Germanium-based substrate, an oxidizing agent source proximate to the Germanium-based substrate, and an actuator. The actuator is linked to the oxidizing agent source and configured to release, upon actuation, an oxidizing agent from the oxidizing agent source onto the Germanium-based substrate, thereby oxidizing the Germanium of the Germanium-based substrate and destroying the electrical device.

In another aspect of at least one embodiment of the invention, a destroy-on-demand electrical device including a Germanium-based substrate is featured. The electrical device includes a Copper-based electrical circuit on the Germanium-based substrate, an oxidizing agent source proximate to the Germanium-based substrate, a salt source proximate to the electrical circuit, and an actuator linked to the oxidizing agent source and the salt source. The actuator is configured to release an oxidizing agent from the oxidizing agent source onto the Germanium-based substrate to oxidize the Germanium of the Germanium-based substrate and further release salt from the salt source on to the Copper-based electrical circuit to dissolve the electric circuit and destroy the electrical device.

In a further aspect of at least one embodiment of the invention, a method for causing on-demand self-destruction of an electrical device is featured. The featured method includes discharging a disintegration agent, from a disintegration source positioned proximate to a substrate of the electrical device, onto the substrate. The substrate is formed from a dissolvable material and includes an electrical circuit disposed thereon.

In yet another aspect of at least one embodiment of the invention, a method for causing on-demand self-destruction of an electrical device is featured. The featured method includes actuating an actuator connected to a disintegration agent source, positioned proximate to the electrical device, to release a disintegration agent from the disintegration source onto the device. The substrate is formed from a dissolvable material and includes an electrical circuit disposed thereon. The disintegration agent disintegrates the substrate upon coming in contact with the substrate.

In another aspect of at least one embodiment of the invention, a method for causing on-demand self-destruction of an electrical device is featured. The featured method includes triggering an oxidizing agent source that is proximate to a Germanium-based substrate supporting an electrical circuit of the electrical device, thereby releasing an oxidizing agent from the oxidizing agent source, and causing the oxidizing agent to contact the Germanium-based substrate and destroy the electrical device.

In a further aspect of at least one embodiment of the invention, a method for causing on-demand self-destruction of an electrical device is featured. The featured method includes actuating an actuator connected to a disintegration agent source and a salt source, positioned proximate to the electrical device, to release a disintegration agent from the disintegration source onto the device to oxidize a Germanium-based substrate of the device and partially destroy the device. The actuator further releases a salt from the salt source onto a Copper-based electrical circuit positioned on the Germanium-based substrate to dissolve the Copper-based electrical circuit and further destroy the device.

In other examples, any of the above aspects, or any system, method, apparatus, and computer program product method described herein, can include one or more of the following features.

The dissolvable material can be at least one of a Germanium-based material, a single crystal Germanium-based material, a polycrystalline consisting of at least 1% Germanium, one or more layers of Polyvinyl alcohol, or a soluble synthetic polymer.

The substrate can be a Germanium-based substrate in the form of $Si_xGe_{1-x}$ and x can be in a range of between about 0.01 and about 0.99. The substrate can be a Germanium-based substrate and include an agitant configured to promote reaction of the disintegration agent source with the Germanium-based substrate to form a Germanium oxide.

The disintegration agent source can contain at least one disintegration agent that causes disintegration of the substrate. The disintegration agent source can further contain at least one disintegration agent that dissolves the disintegrated substrate. The disintegration agent can cause the disintegration of the substrate by oxidizing the substrate. The disintegration agent source can further include a disintegration agent that dissolves the oxidized substrate. The disintegration agent source can further contain at least one disintegration agent that causes disintegration of the electrical circuit. The disintegration agent can be a salt, such as sodium chloride (NaCl). The salt can be dissolved in a liquid before or upon coming in contact with the electrical circuit. The liquid can be water.

The disintegration agent source can contain at least one of aqueous-based salt solution that includes at least one chlorine-based salt, hydrogen peroxide, hydrogen peroxide in a solid form, or reactants that produce hydrogen peroxide upon coming in contact with at least one of water or an acid. The substrate can be a Germanium-based substrate and the disintegration agent source can includes hydrogen peroxide whereby release of the hydrogen peroxide onto the Germanium-based substrate causes oxidization of the Germanium to form a Germanium oxide, thereby destroying the electrical device. The disintegration agent can be aqueous hydrogen peroxide. The one or more components in the disintegration source can include at least one of a percarbonate or a solid sodium percarbonate.

The disintegration agent source can contain at least one disintegration agent that causes disintegration of the substrate. The disintegration agent source can contain at least one disintegration agent that dissolves the disintegrated substrate. The disintegration agent can cause the disintegration of the substrate by oxidizing the substrate. The disintegration agent source can contain a disintegration agent that dissolves the oxidized substrate. The disintegration agent source can contain at least one disintegration agent that causes disintegration of the electrical circuit. The disintegration agent can be a salt. The substrate can include the disintegration agent in inactive form. The inactive disintegration agent can be at least one of an agent that upon activation disintegrates the substrate or an agent that upon activation disintegrates the electrical circuit on the substrate.

At least one of the disintegration agent source or the destroy-on-demand electrical device can be contained or surrounded by a water-tight envelope. The water-tight envelope surrounding the disintegration agent source can contain water and the destruction of the electrical device can be triggered in response to sensing a wireless signal instructing breach of the water-tight envelope containing water.

The electrical circuit can be formed from a conductive material including at least one of Copper-based components or highly doped polysilicon.

The destroy-on-demand electrical device can include an actuator connected to the disintegration agent source. The actuator can trigger, upon actuation, release of a disintegration agent, formed using the one or more components in the disintegration agent source, onto the substrate. The disintegration agent is can disintegrate the substrate, thereby causing destruction of the electrical device.

The destroy-on-demand electrical device can include one or more semi-conductor layers that include the disintegration agent in inactive form. The inactive disintegration agent can be at least one of an agent that upon activation disintegrates the substrate or an agent that upon activation disintegrates the electrical circuit on the substrate.

The actuator can further be connected to a salt source that upon actuation, by the actuator, releases a salt onto the electrical circuit that dissolves the electrical circuit. The actuator can be actuated remotely. The actuator can be actuated upon occurrence of a predetermined event or upon passage of a predetermined amount of time.

The destroy-on-demand electrical device can include a water source positioned proximate to the electrical device. The water source can release water onto the oxidized Germanium and dissolve at least a portion of the substrate.

Other aspects and advantages of the invention can become apparent from the following drawings and description, all of which illustrate the principles of the invention, by way of example only.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

FIG. 6E is a perspective view of an embodiment of a destroy-on-demand electrical device at another stage of disintegration.

DETAILED DESCRIPTION

Figure 1:
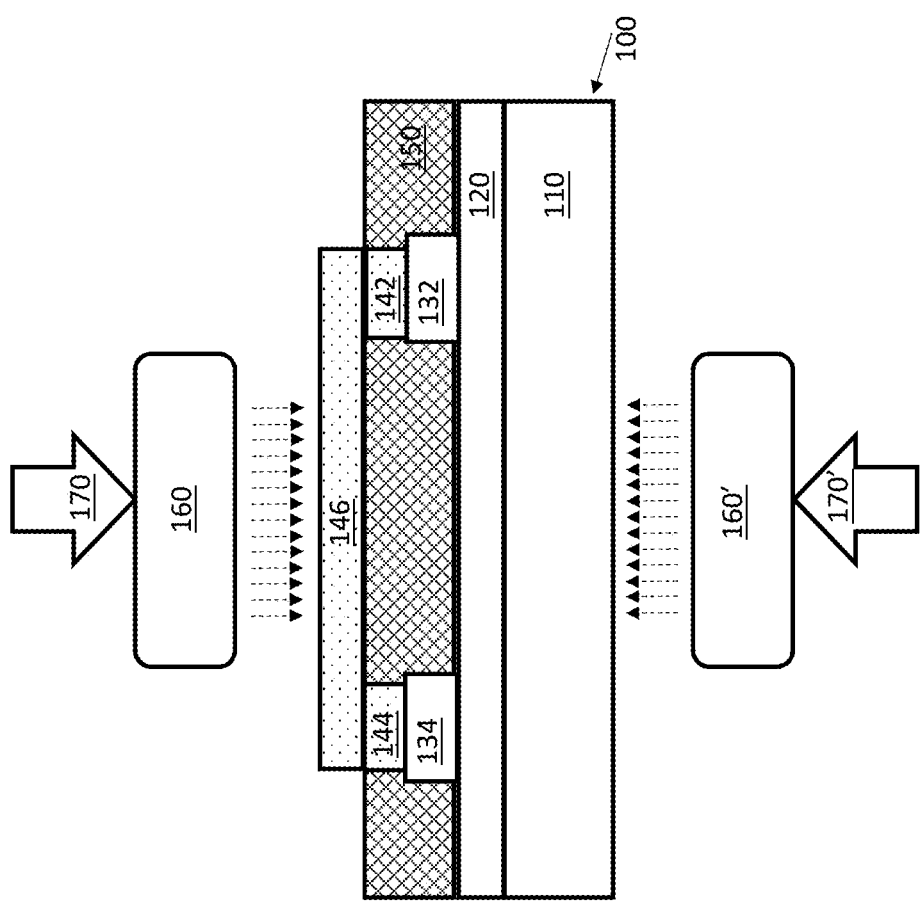
FIG. 1 is a perspective view of an example destroy-on-demand electrical device according to some embodiments described herein.

FIG. 1 is a perspective view of an example destroy-on-demand electrical device 100 according to some embodiments described herein. The destroy-on-demand electrical device 100 can be constructed using high quality single crystal semiconductors that, when exposed to an oxidizing agent (e.g., water or other common chemicals) can completely or partially self-destroy by dissolving or vanishing. The self-destruction can be in a rapid, controlled, and/or triggered manner. The destroy-on-demand electrical device 100 can be any type of electrical device known in the art, such as an active electrical device or a passive electrical device.

A destroy-on-demand electrical device according to the embodiments disclosed herein can be used in field applications that require placement of electrical devices in remote, distributed locations for clandestine use in defense and security applications. The destroy-on-demand electrical device is designed to disappear quickly and potentially upon activation of a trigger. The destroy-on-demand electrical device can be placed in isolation and intended to dissolve spontaneously, or can be coupled or packaged with a reservoir of water or other chemicals in order to accelerate rapid degradation or dissolution upon command.

The destroy-on-demand electrical device can also be used in clinical applications, such as diagnostics, monitoring, therapeutics, drug delivery applications. For example, an embodiment of the destroy-on-demand electrical device that utilizes Germanium can be used in many clinical applications because Germanium has been shown to have relatively low toxicity and has only been deemed unsafe at very high concentrations and for extended periods.

When used in clinical applications, the device can be protected from water and other bodily fluids upon implantation and exposed to these liquids once the operational lifetime is complete. Additionally or alternatively, the device can be packaged with a reservoir that is released upon trigger or command to dissolve the device. The destroy-on-demand electrical device can also be used to manufacture computer chips that only need to work for a predetermined lifetime, since a computer chip manufactured according to the embodiments described herein can easily be recycled using the vanishing and disintegrations procedures described herein.

Although not shown in FIG. 1, the destroy-on-demand electrical device 100 can be coupled to a communications system that allows sending and/or receiving communication signals from a remote control center. The remote control system can send signals instructing the device to initiate or halt self-destruction. Any communication method or technique known in the art can be used. For example, the destroy-on-demand electrical device 100 can be wirelessly connected to a remote control center.

The destroy-on-demand electrical device 100 (hereinafter "device 100") can include multiple layers in a stack. For example, the device 100 can include a substrate layer 110 and a semi-conductor layer 120 positioned on the substrate 110 layer. The substrate layer 110 and the semi-conductor layer 120 can be formed using a water soluble material, such as Germanium, or using a synthetic polymer 110, such as polyvinyl alcohol (PVA, PVOH, or PVAl).

It should be noted that the terms "soluble" and "dissolvable" are used herein to refer to two forms of disintegration. One skilled in the art should appreciate that the embodiments described herein are not necessarily limited to materials that are soluble (e.g., soluble in water) or dissolvable (e.g., dissolvable in water). Any type of material that can disintegrate upon coming in contact with a disintegration agent can be used in conjunctions with the embodiments described herein.

A source electrode 132 and a drain electrode 134 can be formed in contact with the semi-conductor layer 120. The substrate layer 110 can be an insulating or dielectric layer, similar to standard silicon substrate layers typically used in available semi-conductor devices. However, in contrast to standard silicon substrate layers, the substrate layer 110 can be a dielectric that is either a soluble dielectric, such as a Germanium oxide (e.g., $GeO_2$), or a dielectric that can become soluble upon oxidization (e.g., a Germanium-based substrate that forms a soluble Germanium oxide upon oxidization). For example, the dielectric substrate layer 110 can be a single crystal or polycrystalline consisting of at least 1% Germanium. Additionally or alternatively, the substrate layer 110 can be a Germanium-based substrate, formed by clustering Germanium and Silicon crystals. For example, the substrate layer 110 can take the form of $Si_xGe_{1-x}$, where x is in a range varying from 0.1 to 0.99.

Germanium has higher electron and hole mobility than silicon (which currently is commonly used to manufacture chips and similar electrical devices) at low electric fields and can, therefore, be used in high-mobility substrates, either as crystalline Germanium or in the form of $Si_xGe_{1-x}$. A high quality semi-conductor material, such as Germanium, can be used in various applications, including defense, security, and clinical applications. Further, Germanium can produce semi-conductors that possess higher qualities than existing water soluble electronics.

The stoichiometric Germanium oxide, which is water soluble, can be formed by exposing Germanium to hydrogen peroxide. The hydrogen peroxide can be included in solid form in the substrate. Alternatively or additionally, the hydrogen peroxide can be supplied by using materials that can form hydrogen peroxide, after undergoing a chemical reaction, for example upon being exposed to water. For example, the hydrogen peroxide can be created using an acid (e.g., citric acid) and a percarbonate (e.g., sodium percarbonate). The hydrogen peroxide can be included in a disintegration agent source 160, positioned proximate to the device 100.

Additionally or alternatively, a soluble material, such as Polyvinyl alcohol (PVA), which is well-known to be degradable under standard conditions, can be used to form the inter-level dielectric layers of the substrate layer 110. The dissolution rate of the soluble material can be improved by utilizing polymer chemistries that agitate the solution such that a solid state reaction that results in production of a gas is triggered.

Further, some embodiments disclosed herein relate to production and deployment of a substrate that can be used in developing the destroy-on-demand electrical device. Specifically, a substrate according to some embodiments disclosed can be used to produce electrical devices, having high-quality semiconductors and high-quality Copper wiring that upon being exposed to water or other common chemicals or disintegration agents, can dissolve or vanish rapidly and/or completely and in a highly controlled manner.

Typical nano-crystalline silicon-based devices and organic polymer-based devices have reduced performance relative to devices built using high-grade single-crystal silicon devices. In contrast, a destroy-on-demand electronic according to the embodiments described herein does not sacrifice electrical performance relative to non-dissolving standard semiconductor devices. The destroy-on-demand electrical device uses dissolving Copper chloride and Germanium oxide layers and does not suffer in performance relative to non-dissolving standard electrical devices. Further, in contrast to standard devices engineered to self-destruct via techniques such as energetic silicon technology, shattering techniques, heating, melting, etching and chemical dissolution techniques, the Germanium and Copper based electrical device does not leave behind any particulates and does not result in highly reactive, explosive, forceful or otherwise easily visible or detectable destructive events.

The semi-conductor layer 120 can also be formed of a material that is either soluble or can become soluble upon oxidization. For example, the semi-conductor layer 120 can be a layer formed of Germanium. The use of Germanium in the semi-conductor layer 120 can expedite the self-destruction of the device 100. Specifically, the Germanium used in the semiconducting layers can be converted to Germanium Oxide ($GeO_2$) using an agent such as Hydrogen Peroxide ($H_2O_2$), used at room temperature or higher. The destroy-on-demand electrical device 100 can destroy the semi-conductor layer 120 by using room temperature water by dissolving the Germanium Oxide ($GeO_2$) based insulating layers with water.

It should be noted that although higher temperatures can accelerate the oxidization process, even at room temperature this process occurs at a reasonable rate. For example, the rate of conversion from Germanium to Germanium Oxide can be at about 1.2 milligrams/centimeter$^2$ per hour at while operating at a temperature of 20 degrees (Celsius). Increasing the temperature to 50° C. can change the conversion rate to 4.2 milligrams/centimeter$^2$ per hour. A further increase in the temperature to 70° C. can change the conversion rate to 8 milligrams/centimeter$^2$ per hour. Given that the density of Ge is around 5.5 g/cm$^3$, these dissolution rates can be converted to etch rates by dividing these rates by their respective densities. Therefore, at 20° C., an etch rate of about 2 microns per hour can be achieved. Conversion of Germanium to Germanium Oxide ($GeO_2$) and subsequent dissolution can occur at a rate of about 400 atoms/minute using a 9:1 mixture of water to hydrogen peroxide ($H_2O$:$H_2O_2$). Once the Germanium Oxide ($GeO_2$) is formed, the resulting Germanium Oxide ($GeO_2$) layers can be dissolved with water, causing further destruction of the device.

Conducting layers or patterns can be made on the semi-conductor layer 120 using a conductive material. The conductive material can be a material that can rapidly disintegrate once the underlying semi-conductor 120 and/or substrate layers 110 have disintegrated or dissolved. Additionally or alternatively, the conductive material can be a material that can dissolve or disintegrate in response to being exposed to a disintegration agent, such as a salt.

For example, conductive patterns or traces can be made in the conductive material (e.g., which can be formed using a metallic element, such as Copper) and the conductive material can be deposited under a highly stressed condition in order to facilitate disintegration of the conductive material once the underlying semi-conductor 120 and/or substrate layers 110 have disintegrated or dissolved (or begun to disintegrate or dissolve). Alternatively or additionally, a disintegration agent, such as a salt (e.g., NaCl), can be used to expedite the disintegration of the conductive materials.

High quality metals are among conductive materials that can be used with the soluble semi-conductor 120 and substrate layers 110. Alternatively or additionally, the conductive layer or pattern can be deposited using a highly doped polysilicon. High quality metals (e.g., Copper) can be integrated with water dissolvable dielectrics but need not to be dissolvable in water at a high rate because they can disintegrate once the underlying substrate material has dissolved. Further, an element such as Copper can dissolve much more rapidly when chloride-based salts are included in the substrate. Therefore, the substrate layer 110 can be formed by inclusion of a chloride-based salts, such as sodium chloride (NaCl) to ensure rapid dissolution of the metallic material. It should be noted that the use of Copper wiring with Germanium is superior to traditionally used Magnesium wiring because Germanium has lower resistance than Magnesium.

Referring back to the example shown in FIG. 1, a conductive layer, including conductive two elements 142, 144 are deposited on the source electrode 132 and the drain electrode 134 and interconnected using a conductive interconnect 146. The, the conductive layers 142, 144 and/or conductive interconnect 146 can be formed using any conductive material that can disintegrate once its underlying or connecting layers have dissolved or disintegrated or begun to disintegrate or dissolve. For example, the conductive interconnect 146 can be formed using Copper. Additionally or alternatively, the conductive layers 142, 144 and/or the conductive interconnect 146 can be made from any conductive material that can disintegrate when exposed to a disintegration agent, such as a salt. The conductive layers, traces, or patterns can be fabricated into the connecting semi-conductor or dielectric layers using similar fabrication technology as that used for manufacturing and fabrication of standard silicon-based electrical devices.

The device 100 can further include a dielectric or insulating layer 150 that covers one or more portions and/or the entire structure of the device 100. As shown in FIG. 1, the conductive interconnect 146 can be formed on the dielectric layer 150 such that the dielectric layer 150 serves as an underlying, connective or supportive, layer to the conductive interconnect 146.

The dielectric layer 150 can be formed of a material that is either a soluble dielectric, such as Germanium oxide (e.g., GeO$_2$), or a dielectric that can become soluble upon oxidization (e.g., a Germanium-based substrate that forms Germanium oxide upon oxidization). For example, the dielectric layer 150 can be a water soluble synthetic polymer 110, such as polyvinyl alcohol (PVA, PVOH, or PVAl). The dielectric layer 150 and the substrate 110 can be formed using the same or similar materials. Alternatively or additionally, the dielectric layer 150 and the substrate 110 can be formed using entirely different materials. Further, at least one of the substrate 110 or the semi-conductor layer 120 can be commercial off the shelf (COTS) elements. The source electrode 132 and the drain electrode 134 can also be COTS elements that are interconnected to the device 100 through a back end of line (BEOL) wiring process. The two conductive layers 142, 144 can be interconnected to the device 100 through the existing circuitry created by the source electrode 132 and the drain electrode 134.

Various chemicals and combinations of chemicals can be used to produce the substrate 110 and dielectric 150 layers used with the destroy-on-demand electrical device. For example, one or more (or a combination of) chemicals or materials that are known for having less robust chemistries or materials known to have chemistries that are prone to degradation can be used. Such materials and chemistries can promote the self-destruction of the electrical device by facilitating the dissolution of the functional electronic materials. The transience associated with the chemistries of these materials can make substrates and electrical devices formed from such materials environmentally friendly or "green" (i.e., environmentally compatible). Further, specific salts and acids can be used to degrade and vanish high-quality electronical materials, such as crystalline semiconductors and Copper wiring.

The device 100 can also be coupled with a disintegration agent source 160, 160'. The dissolving agent source 160, 160' can be positioned proximate or adjacent to the device 100 and/or be included within the device 100. Although shown as having two dissolving sources 160, 160', the device 100 can have one or more than two disintegration agent sources 160, 160'. Alternatively, the device 100 can be configured such that it does not include or is coupled with any specific disintegration source and, instead, utilizes the elements in it surrounding area (e.g., air, water, bodily fluids, etc.) as its disintegration agent source.

The disintegration agent, once in contact with the soluble dielectric 150, semi-conductor 120, and/or substrate layers 110 can cause these layers 110, 120, 150 to disintegrate (e.g., by dissolving these layers, oxidizing with the layers, and/or carrying out a chemical reaction with the layers that results in loss of integrity in the layer), thereby destroying the electrical device 110.

For example, the disintegration agent can be positioned in a liquid tight container (e.g., envelope) proximate to the device and configured such that upon release of the agent from the disintegration agent source 160, 160'', the disintegration agent(s) comes in contact with the device and results in disintegration, dissolution, and/or destruction of the device. In FIG. 1, arrows drawn from the disintegration agent source 160, 160' toward the electric device 100 are intended to show the eventual contact made between the device 100 and the disintegration agent flowing out of the disintegration source 160.

The disintegration source 160, 160' can be a reservoir that holds a disintegration agent. For example, the disintegration agent can be aqueous hydrogen peroxide, held in the reservoir in liquid form. Alternatively or additionally, the disintegration source 160, 160' can hold a material or substance that upon coming in contact with a fluid results on creation of a disintegration agent. For example, the disintegration source 160, 160' can hold a percarbonate, such as sodium percarbonate, in solid form. The sodium percarbonate contained in the disintegration source 160, 160' is water soluble and can, upon being dissolved in water, create a disintegration agent (i.e., hydrogen peroxide).

As noted, the device 100 can include any number of disintegration agent sources 160, 160'. For example, the disintegration sources 160, 160' can include various disintegration agents. For example, the device 100 can include a disintegration source 160 including an agent that can result in disintegration of the substrate and/or semi-conductor layers, another disintegration source 160' that includes an agent that results in disintegration of the conductive layers, and yet another disintegration source (not shown) that includes an agent that can dissolve the disintegrated layers. For example, in one embodiment, the device 100 can include a disintegration source containing hydrogen peroxide that can oxidize Germanium-based substrate and/or semi-conductor layers. The device 100 can also include another disintegration source including a salt that can disintegrate copper-based conductive layers of the device. The device can further include a water source that dissolves the oxidized Germanium layers and the disintegrated copper-based layers. As noted, the disintegration agent source can be internal or external to the device (positioned in proximity of the device or brought into close physical proximity of the device).

As noted, the disintegration of the device 100 can be achieved through oxidization. For example, the disintegration agent source 160, 160' can include an oxidizing agent (e.g., aqueous hydrogen peroxide) or a material that can result in creation of a oxidizing agent (e.g., hydrogen peroxide) upon coming in contact with water or other fluids. This oxidizing agent, once in contact with the device 100, results in oxidization of soluble substrate 110, semiconductor 120, and/or dielectric 150 layers. The disintegration of underlying semiconductor 120 and insulating layers (substrate 110 and dielectric 150 layers) facilitates the disintegration of any conductive layers 142, 144 and/or the conductive interconnect 146 that are supported by the semiconductor 120 and insulating layers 110, 150. Other disintegration agents, such as salts, can also be used to disintegrate the device. The disintegrated device can further be partially or completely dissolved by a disintegration agent (e.g., water). This can ultimately result in destruction of the electrical device 100.

The destruction of the device 100 can be performed in a controlled and/or triggered manner by controlling the release and/or creation of the disintegration agent(s). For example, as shown in FIG. 1, the disintegration agent source 160, 160' can be coupled with an actuator or a trigger 170, 170' that upon activation, triggers release and/or creation of the disintegration agent. The actuator or trigger 170, 170' can be activated manually or remotely. Any actuation or triggering technique known in the art can be used.

The trigger or actuator 170, 170' can be arranged such that it is activated after a predetermined amount of time has lapsed (e.g., a predetermined number of seconds, minutes, hours, etc.) or if/when the trigger has come in contact with a certain object, material, or force (e.g., once a predetermined amount of force has been applied to the trigger, once the trigger has been exposed to the elements, once the ambient temperature has reached a predetermined value, etc.).

The destroy-on-demand electrical device disclosed herein invokes instability of Germanium as a means to enable vanishing devices and systems using water and mild chemical solutions to effect the total dissolution. Specifically, in place of a standard silicon semiconductor layer used in most electrical devices, the destroy-on-demand electrical device 100 uses a layer of Germanium or materials having similar properties. Additionally, in place of a standard silicon dioxide insulating layer often used in most electrical devices, the destroy-on-demand electrical device 100 uses a layer of Germanium oxide or other soluble dielectric. Conducting patterns or traces may be made using Copper, deposited under a highly stressed condition in order to facilitate disintegration once the underlying semiconducting and insulating layers have dissolved. These layers can be patterned and fabricated into semiconducting devices in much the same way as silicon micro-device technology proceeds, while making required alterations for use along with Germanium-based transistors and other devices.

A specific electrical device can be realized in a vanishing configuration according to the embodiments described herein by defining a device type, geometry, and also a dissolution process for the device. Specifically, dimensions of the device are considered to ensure that the device can achieve a certain level of performance and that the device is amenable to dissolution in a practical timeframe. As noted, access to disintegration agents, such as water and hydrogen peroxide stored in a reservoir (i.e., disintegration agent source), can be provided in order to enable dissolution upon triggering.

In contrast to most existing vanishing electrical devices, which are typically constructed using nano-crystalline silicon or organic polymers that result in significant degradation of performance versus single crystal silicon, a destroy-on-demand electrical device according to the embodiments disclosed herein can use high-quality crystalline semiconductors that intended to be transient, dissolving, or vanishing. Further, the highly controlled and triggered procedures used for self-destruction of the destroy-on-demand electrical devices described herein allow these devices to dissolve or vanish without leaving behind traces of the device, either particulate matter or the resulting smoke, heat, light, noise or other effects arising from the destruction process.

Electrical devices produced and deployed according to the embodiments disclosed herein can be high-quality single crystal semiconductors that can, when exposed to water or other common chemicals, completely dissolve or vanish rapidly and in a highly controlled manner. A destroy-on-demand electrical device according to the disclosed embodiments can include a class of devices and materials of construction that can achieve very high electronic performance (e.g., as characterized by typical parameters such as switching speed) while being destroyable on demand.

Most electrical devices are typically built using single-crystal silicon and a variety of device types, such as bipolar transistors, field effect transistors, junction diodes, Schottky diodes, etc. For high-speed, low voltage and optoelectronic applications, compound semiconductors such as Gallium Arsenide (GaAs) or Gallium Nitride (GaN) are often used. More complex compound materials such as Iridium Gallium Arsenide (InGaAs) and other ternary compounds can also be invoked for specific applications. Among the Group IV semiconductors, silicon is predominately used. Although other members of Group IV, such as Diamond, Germanium (Ge), and Tin (Sn) also have semiconducting properties, these elements are less commonly used for a variety of reasons, including cost and performance in traditional applications. In fact, in spite of its presence predominance in the semiconductor industry, silicon was not the first material invoked to construct a transistor. Germanium (Ge) was initially used, during most seminal experiments, but its use was quickly abandoned due to the instabilities associated with the Germanium Oxide. This instability (i.e., $GeO_2$ is soluble in water) was initially important for demonstration of the first point contact transistor in Germanium but eventually led to the transition toward the use of silicon, due to stability and performance considerations.

Most semiconductor devices rely upon the presence of a high-quality semiconductor layer, defined from a performance perspective as having particular values for the electron and hole mobility, an absence of point and extended defects that can affect electron or hole carrier lifetimes via recombination or other loss mechanisms, and an ability to be processed in flat, smooth, thin layers in order to produce microscale devices as part of logic circuits for memory, processors, sensing and other applications. Field effect transistors also require very high quality insulating layers, capable of minimizing leakage currents and sustaining high electric fields without breakdown, and also to store charge and limit current flow. For many years silicon dioxide performed this role, until the advent of high-K dielectric technology.

Figure 2:
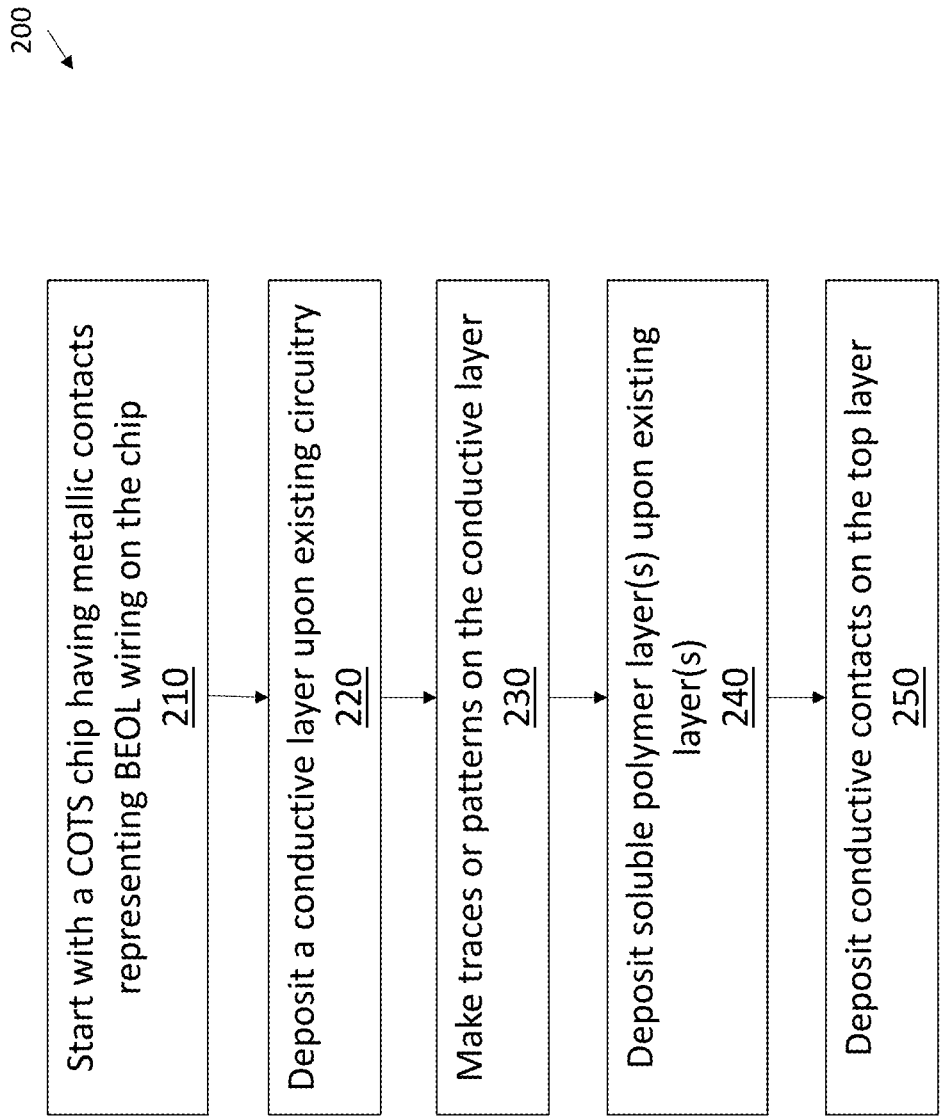
FIG. 2 is a flow diagram procedures for producing a destroy-on-demand electrical device according to some embodiments described herein.

FIG. 2 is a flow diagram 200 of procedures for producing a destroy-on-demand electrical device according to some embodiments described herein. FIG. 3A-3D illustrate the destroy-on-demand electrical device at various stages of manufacture. As shown in FIG. 2, a destroy-on-demand electrical device can be produced using a commercial off the shelf (COTS) chip (e.g., a chip manufactured by Taiwan Semiconductor manufacturing Company (TMSC)). The chip can have one or more metallic (e.g., Gold (AU)) contacts that include similar connections as those made during the back end of line (BEOL) portion of a typical chip fabrication process. For example, as shown in FIG. 3A, the destroy-on-demand device can be produced using a semi-conductor 320 that is interconnected with wires on the semi-conductor layer 320 to a conductive metallic layer 311. The metallic layer 311 can include individual devices, such as transistors, electrodes, capacitors, resistors, etc. In the example shown in FIG. 3A, the metallic layer 311 is shown as having a source electrode 332 and a drain electrode 334. Generally, the metallic layer 311 can have any number or type of devices. As noted, the semi-conductor layer 320 can be formed used available commercial off the shelf materials. Further, in some embodiments, the semi-conductor layer 320 can be formed using a biodegradable material, a soluble material, or a material that can become soluble upon oxidization (e.g., a Germanium-based material that forms Germanium oxide upon oxidization).

An additional conductive layer 321 can be deposited on the existing circuitry (FIG. 2, box 220). The additional conductive layer 321 can be formed using a metallic material, such as Copper (CU) or any other conductive material that can rapidly disintegrate once its interconnecting layers have disintegrated. In the example shown in FIG. 3B, conductive contacts 342, 344 (possibly made from Copper) are stored on the source electrode 332 and the drain electrode 334, respectively. The additional conductive layer 321 can be deposited under high stress conditions in order to facilitate disintegration of the conductive material once its connecting layers have disintegrated.

Conductive patterns or traces can be made in the additional conductive layer 321. For example, conductive patterns or traces can be made in the additional material layer 321 using a metallic element, such as Copper.

A soluble material or polymer can be deposited on the existing layers (box 240). The soluble material or polymer can be a water soluble synthetic polymer 110. For example, a soluble polymer such as polyvinyl alcohol (PVA, PVOH, or PVAI), a soluble dielectric such as Germanium oxide (e.g., $GeO_2$), or any other dielectric that can become soluble upon oxidization (e.g., a Germanium-based substrate that forms Germanium oxide upon oxidization) can be used.

Figure 3B:
FIG. 3B is a perspective view of an embodiment of a destroy-on-demand electrical device at one stage of manufacture.
Figure 3D:
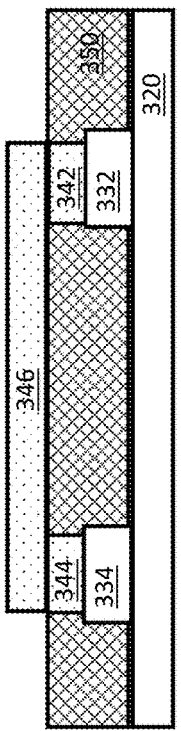
FIG. 3D is a perspective view of an embodiment of a destroy-on-demand electrical device at yet another stage of manufacture.
Figure 3A:
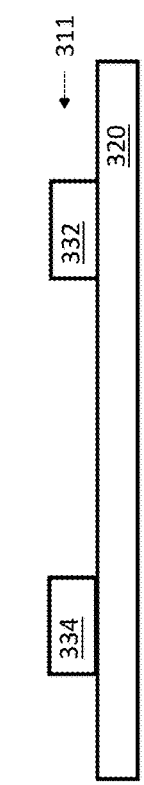
FIG. 3A is a perspective view of an embodiment of a destroy-on-demand electrical device at an initial stage of manufacture.
Figure 3C:
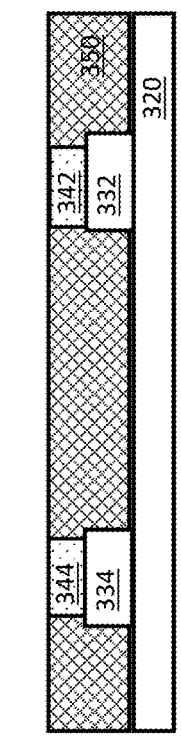
FIG. 3C is a perspective view of an embodiment of a destroy-on-demand electrical device at another stage of manufacture.

As shown in FIG. 3C, the soluble dielectric layer 350 covers one or more portions and/or the entire structure of the destroy-on-demand device. Although not shown in FIG. 3C, the soluble dielectric 350 can also cover some portions (or the entire) structure of the semi-conductor layer 320. As noted above, the semi-conductor layer 320 can be made from commercial off the shelf materials and/or from a soluble material or polymer.

As shown in FIG. 3D, a conductive interconnect 346 can be deposited on the dielectric layer 350 (FIG. 2, Box 250). The conductive interconnect 346 can be formed from any conductive material that can disintegrate once its underlying or connecting layers have dissolved or disintegrated or begun to disintegrate or dissolve. For example, the conductive interconnect 346 can be formed using Copper. Additionally or alternatively, the conductive layers 342, 344 and/or the conductive interconnect 346 can be made from any conductive material that can disintegrate once its underlying or connecting layers have dissolved or disintegrated or begun to disintegrate or dissolve.

Figure 4B:
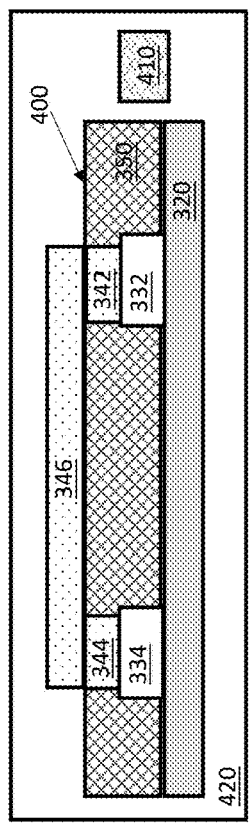
FIG. 4B is a perspective view of another example of the destroy-on-demand electrical device, according to an embodiment disclosed herein.
Figure 4C:
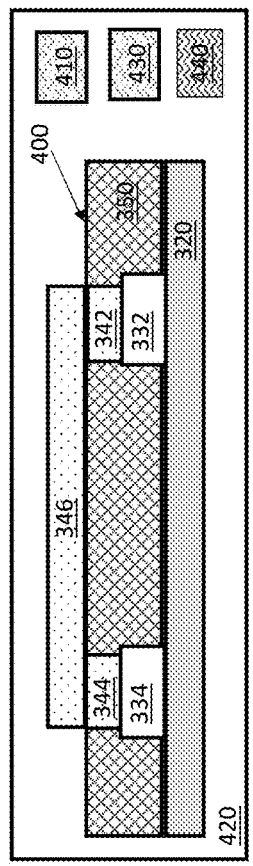
FIG. 4C is a perspective view of another example of the destroy-on-demand electrical device, according to an embodiment disclosed herein.
Figure 4A:
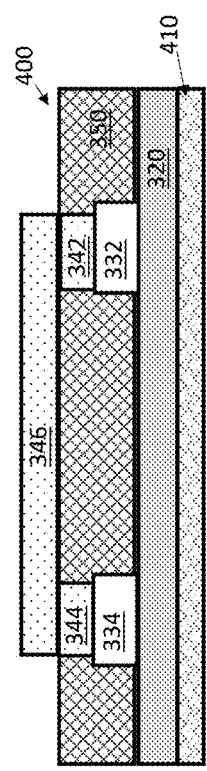
FIG. 4A is a perspective view of an example of the destroy-on-demand electrical device, according to an embodiment disclosed herein.

FIG. 4A is a perspective view of the destroy-on-demand electrical device 400, according to an embodiment disclosed herein. The destroy-on-demand device 400 can include multiple layers in a stack. For example, the device 400 can have a semi-conductor layer 320, which can be interconnected with wires on the semi-conductor layer 320 to one or more devices 332, 334 included in a conductive metallic layer. The devices 332, 334 can be electrical devices such as transistors, electrodes, capacitors, resistors, etc. The semi-conductor layer 320 can be a commercial off the shelf semi-conductor and/or be made using a biodegradable material, a soluble material, or a material that can become soluble upon oxidization (e.g., a Germanium-based material that forms Germanium oxide upon oxidization). Although not shown in FIG. 4, the destroy-on-demand device 400 can include a dielectric layer (not shown) adjacent to the semi-conductor layer 320 (e.g., similar to the example embodiment shown in FIG. 1).

The destroy-on-demand device 400 can also include an additional conductive layer including conductive contacts 342, 344. The additional conductive layer 321 can be formed using a metallic material, such as Copper (CU) or any other conductive material that can rapidly disintegrate once its interconnecting layers have disintegrated or in presence of a disintegration agent. The destroy-on-demand device 400 can also include a soluble dielectric layer 350 that covers one or more portions and/or the entire structure of the destroy-on-demand device.

The destroy-on-demand electrical device 400 can further include an oxidization agent source 410. Although shown as a part of the destroy-on-demand electrical device 400, the disintegration source need not to be an integral part of the destroy-on-demand electrical device 400 and can instead be placed adjacent to the device 400 or in close proximity of the device 400. In some embodiments, the destroy-on-demand electrical device 400 can be configured such that it is not coupled with a disintegration agent source. For example, the destroy-on-demand electrical device 400 can be configured to receive the disintegration agent from the surrounding environment and/or by any other means known in the art.

The disintegration agent source 410 can be positioned adjacent to a specific portion or layer of the device 400. For example, as shown in FIG. 4A, the disintegration agent source 410 can be positioned adjacent to the semi-conductor layer 320. Alternatively/additionally, the disintegration agent source 410, can be positioned in close proximity of the device 400. For example, as shown in FIG. 4B, the disintegration agent source 410 can be included in a sealed envelope or package 420 that contains both the destroy-on-demand electrical device 400 and the disintegration agent source 410.

Although the destroy-on-demand electrical device 400 is described herein as using an disintegration source that uses oxidization to carry on its self-destruction procedures (described later with respect to FIG. 6A-6D), embodiments of the destroy-on-demand electrical device 400 are not limited to the use of oxygen or its by product, or oxidization in general, for self-destruction. Any agent that can expedite the destruction of various components of the destroy-on-demand electrical device can be used. Therefore, the disintegration agent source 410 can be any source that contains an agent that can trigger the disintegration of the various components of the destroy-on-demand electrical device 400.

The disintegration source 410 can be coupled with a trigger or an actuator (not shown) that upon activation triggers release and/or creation of the disintegration agent. The actuator or trigger 170, 170' (FIG. 1) can be activated manually or remotely. Any technique known in the art can be used to trigger or actuate the actuator.

The disintegration source 410 can be configured such that it triggers release and/or creation of the disintegration agent upon occurrence of a predetermined condition. For example, the disintegration source 410 can be made from a material that dissolves or disintegrates in response to being exposed to factors such as wind, rain, sunlight, pressure, force, bodily fluids, etc. The disintegration of the material forming the disintegration source 410 can, in turn, lead to release and/or creation of the disintegration agent (not shown).

The destroy-on-demand electrical device 400 can be coupled with more than one disintegration agent source. For example, as shown in FIG. 4C, the destroy-on-demand electrical device 400 can include a two or more disintegration agent sources 410, 430, 440. The disintegration agent sources 410, 430 can include same or different materials. Additionally or alternatively, one or more of the disintegration agent sources 410, 430 can include a material that upon release or activation, triggers release or activation of other disintegration agent sources 410. For example, in one embodiment, one disintegration agent source 410 can include water and another disintegration agent source 430 can contain a percarbonate, such as sodium percarbonate, in solid form. Yet another disintegration agent source 440 can include a salt, such as sodium chloride.

The actuation of the disintegration agent source 410 that contains water can trigger the release of water from this disintegration agent source 410 onto the device 400 and the other disintegration agent sources 420, 440. The disintegration agent sources 420, 440 can be configured such that it releases its contents upon coming in contact with water or upon receiving any other form of trigger (e.g., by being actuated by a remote source). Once the contents of the second disintegration agent source 420 (and/or third disintegration agent source 440) are released, the combination of the sodium percarbonate from the second disintegration agent source 420 and the water released from the first disintegration source 410 can form an oxidization agent (i.e., Hydrogen peroxide) that can be used to expedite the self-destruction of the device 400. The combination of the salt in the third disintegration source 430 and water can also create a solution that expedite disintegration of the conductive layers and/or other components of the device 400.

Although shown as being positioned within the envelope containing the destroy-on-demand electrical device 400, each of the one or more of the disintegration agent sources 410, 430 can be positioned within or outside of the envelope 420 that surrounds the device. For example, in one embodiment, the first disintegration agent source 410 can be positioned outside of the envelope 420 and arranged such that it releases water onto the envelope 420 containing the device 400. The envelope 420 can be formed from a material that is water soluble, thereby dissolving upon coming in contact with water. Alternatively or additionally, the envelope 420 can be made of a material that includes perforations that allow the agent released by the first disintegration agent source 410 to travel through the envelope to the device 400. Similarly, the second disintegration agent source 420 can be formed from a material that allows for the molecules of the agent released by the first disintegration agent source 410 to penetrate through the walls of the second disintegration agent source 420 to reach the contents of the second disintegration agent source 420. The released water can dissolve the sodium percarbonate contained in the second disintegration agent source 420, thereby forming Hydrogen peroxide. The water and hydrogen peroxide can initiate and expedite the self-destruction of the device 400.

Figure 5:
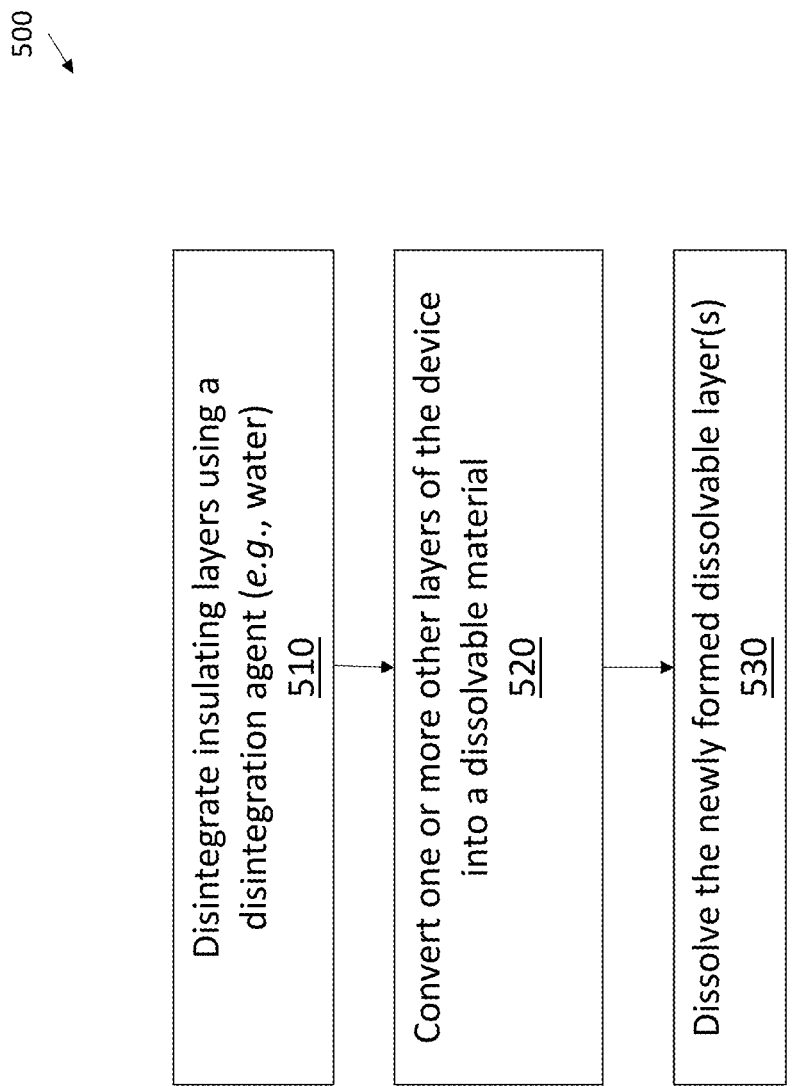
FIG. 5 is a flow diagram of possible procedures for self-destruction of an example destroy-on-demand electrical device, according to an embodiment disclosed herein.
Figure 6A:
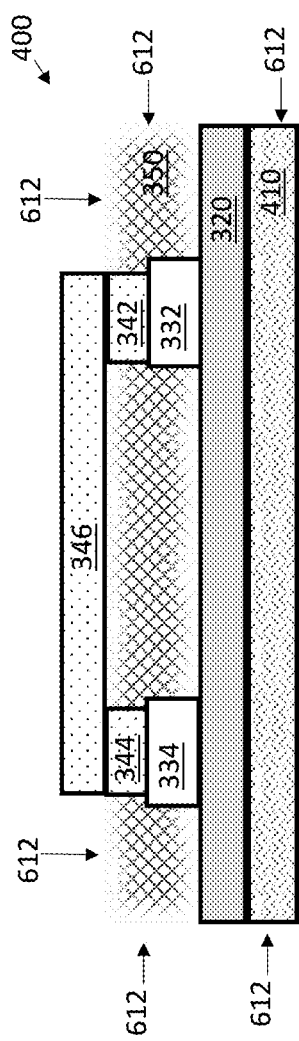
FIG. 6A is a perspective view of an embodiment of a destroy-on-demand electrical device at an initial stage of disintegration.
Figure 6B:
FIG. 6B is a perspective view of an embodiment of a destroy-on-demand electrical device at another stage of disintegration.

FIG. 5 is a flow diagram 500 of possible procedures for self-destruction of an example destroy-on-demand electrical device. FIG. 6A-6D illustrate a perspective view of an embodiment of a destroy-on-demand electrical device at various stages of disintegration. As shown in FIG. 5, the self-destruction procedures can involve dissolving insulating layers of the destroy-on-demand electrical device with a disintegration agent. For example, as shown in FIG. 6A, the insulating layer 350 of the example device 400 shown in FIG. 4A can be dissolved using a disintegration agent 612. For example, assuming that the insulating layer 350 is formed using a dissolvable material, such as Germanium Oxide ($GeO_2$), this layer 350 can be dissolved using room temperature water 612.

The disintegration of the dissolvable insulating layers 350 can in turn lead to disintegration of the additional conductive materials 342, 344 and their conductive interconnect 346. As noted previously, the additional conductive materials 342, 344 and their conductive interconnect 346 can be made using a material, such as Copper and deposited under a highly stressed condition in order to facilitate disintegration once the underlying semiconducting and insulating layers have dissolved.

Disintegration agents can also be used to prepare the insulating layer, conductive materials, and/or other parts of the device 400 that may not be readily dissolvable for destruction. For example, the contents of the disintegration agent source 410 can be used to prepare an agent that promotes further destruction of the device 400. For example, assuming that the disintegration agent source 410 holds sodium percarbonate, water 612 can be combined with the sodium percarbonate contained in the disintegration agent source 410 to form hydrogen peroxide 618 (FIG. 6B) for use in further destruction of the device 400. Similarly, assuming that the disintegration agent source 410 holds a salt such as sodium chloride, water 612 can be combined with the sodium chloride contained in the disintegration agent source 410 to form an agent (FIG. 6B) for use in destruction of the conductive parts 342, 344, 346.

Figure 6C:
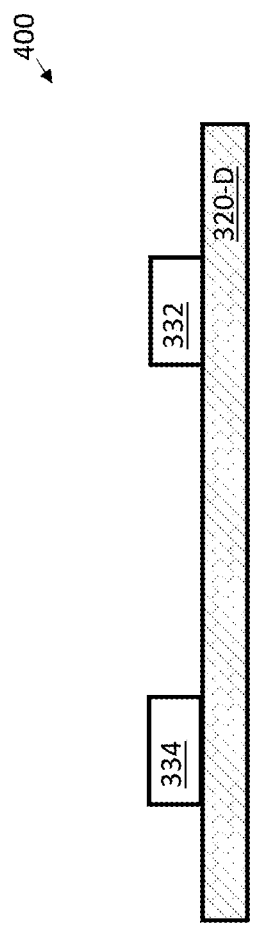
FIG. 6C is a perspective view of an embodiment of a destroy-on-demand electrical device at yet another stage of disintegration.

As shown in FIG. 6C, other layers of the device 400 can be exposed to the disintegration agent 618 (e.g., hydrogen peroxide) to form dissolvable materials (FIG. 5, box 520). For example, assuming that the semi-conductor layer 320 of the device 400 is formed using Germanium (Ge), hydrogen peroxide 618 can be used to convert the Germanium material used in the semi-conductor layer 320 (FIG. 6B) to Germanium oxide ($GeO_2$) 320-D (FIG. 6C). Similar procedures can be applied if the substrate layer 320 is not readily dissolvable.

Figure 6D:
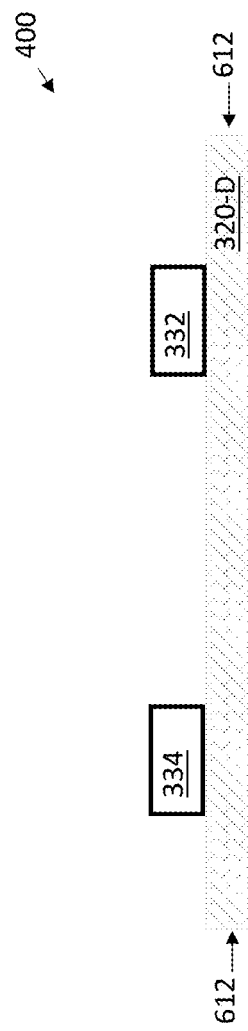
FIG. 6D is a perspective view of an embodiment of a destroy-on-demand electrical device at another stage of disintegration.
Figure 6E:
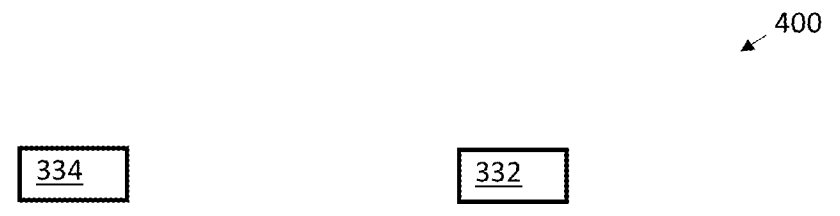

Once the material forming other layer(s) has been converted into a corresponding dissolvable material, these layers can be destroyed through the application of a proper disintegration agent (FIG. 5, box 530). For example, as shown in FIG. 6D, room temperature water 612 can be applied to the Germanium oxide ($GeO_2$) 320-D formed on the semi-conductor layer to dissolve this layer. Once the oxidized semi-conductor layer 320-D is dissolved, the device 400 is completely destroyed, leaving out only minimal parts 332, 334, as shown in FIG. 6E.

The remaining elements 332, 334 can also be disintegrated and/or dissolved. Specifically, one or more agents containing elements that can disintegrate or dissolve these elements can be used to achieve complete destruction of the device. For example, an agent that disintegrates these elements 332, 334 can be applied (e.g., a salt) to disintegrate these elements. Once disintegrated, an appropriate solvent (e.g., water) can be applied to completely dissolve and destroy the device.

While the invention has been particularly shown and described with reference to specific illustrative embodiments, it should be understood that various changes in form and detail may be made without departing from the spirit and scope of the invention.

What is claimed is:

1. A destroy-on-demand electrical device, comprising:
    a substrate formed from a dissolvable material;
    an electrical circuit on the substrate;
    a disintegration agent source containing one or more disintegration agents that cause
    destruction of the electrical device upon coming in contact with the substrate, wherein the disintegration agent source contains at least one disintegration agent that causes disintegration of the substrate.

2. The destroy-on-demand electrical device of claim 1 wherein the dissolvable material is at least one of a Germanium-based material, a single crystal Germanium-based material, a polycrystalline consisting of at least 1% Germanium, one or more layers of Polyvinyl alcohol, or a water soluble synthetic polymer.

3. The destroy-on-demand electrical device of claim 1 wherein the dissolvable material is at least one of a Germanium-based material, a single crystal Germanium-based material, a polycrystalline consisting of at least 1% Germanium, one or more layers of Polyvinyl alcohol, or a soluble synthetic polymer.

4. The destroy-on-demand electrical device of claim 1 wherein the electrical circuit is formed from a conductive material including at least one of Copper-based components or highly doped polysilicon.

5. The destroy-on-demand electrical device of claim 1 wherein the disintegration agent source contains at least one of aqueous-based salt solution that includes at least one chlorine-based salt, hydrogen peroxide, hydrogen peroxide in a solid form, or reactants that produce hydrogen peroxide upon coming in contact with at least one of water or an acid.

6. The destroy-on-demand electrical device of claim 1 wherein the substrate is a Germanium-based substrate and the disintegration agent source includes hydrogen peroxide whereby release of the hydrogen peroxide onto the Germanium-based substrate causes oxidization of the Germanium to form a Germanium oxide, thereby destroying the electrical device.

7. The destroy-on-demand electrical device of claim 6 further including a water source positioned proximate to the electrical device wherein the water source is configured to release water onto the oxidized Germanium and dissolve at least a portion of the substrate.

8. The destroy-on-demand electrical device of claim 1 wherein the disintegration agent is at least one of aqueous hydrogen peroxide or water.

9. The destroy-on-demand electrical device of claim 8 wherein the disintegration agent source contains a disintegration agent that dissolves the oxidized substrate.

10. The destroy-on-demand electrical device of claim 1 wherein the one or more components in the disintegration source include at least one of a percarbonate or a solid sodium percarbonate.

11. The destroy-on-demand electrical device of claim 1 wherein at least one of the disintegration agent source or the destroy-on-demand electrical device is contained by a water-tight envelope.

12. The destroy-on-demand electrical device of claim 11 wherein the water-tight envelope surrounding the disintegration agent source contains water and wherein destruction of the electrical device is triggered in response to sensing a wireless signal instructing breach of the water-tight envelope containing water.

13. The destroy-on-demand electrical device of claim 1 wherein the substrate is a Germanium-based substrate in the form of SixGe 1-x, wherein x is in a range of between about 0.01 and about 1.0.

14. The destroy-on-demand electrical device of claim 1 wherein the substrate is a Germanium-based substrate and further including an agitant configured to promote reaction of the disintegration agent source with the Germanium-based substrate to form a Germanium oxide.

15. The destroy-on-demand electrical device of claim 1 further including an actuator connected to the disintegration agent source, the actuator being configured to, upon actuation, release of a disintegration agent, formed using the one or more components in the disintegration agent source, onto the substrate, wherein the disintegration agent is configured to disintegrate the substrate, thereby causing destruction of the electrical device.

16. The destroy-on-demand electrical device of claim 15 wherein the actuator is further connected to a salt source that upon actuation, by the actuator, releases a salt onto the electrical circuit that dissolves the electrical circuit.

17. The destroy-on-demand electrical device of claim 15 wherein the actuator is actuated remotely.

18. The destroy-on-demand electrical device of claim 15 wherein the actuator is actuated upon occurrence of a predetermined event or upon passage of a predetermined amount of time.

19. The destroy-on-demand electrical device of claim 1 wherein the disintegration agent source contains at least one disintegration agent that dissolves the disintegrated substrate.

20. The destroy-on-demand electrical device of claim 1 wherein the disintegration agent causes the disintegration of the substrate by oxidizing the substrate.

21. The destroy-on-demand electrical device of claim 1 wherein the disintegration agent source contains at least one disintegration agent that causes disintegration of the electrical circuit.

22. The destroy- on-demand electrical device of claim 21 wherein the disintegration agent is a salt.

23. The destroy-on-demand electrical device of claim 1 wherein the substrate contains at least one disintegration agent in inactive form.

* * * * *